(12) United States Patent
Gaylord et al.

(10) Patent No.: US 9,673,038 B2
(45) Date of Patent: Jun. 6, 2017

(54) GAS PHASE OXIDE REMOVAL AND PASSIVATION OF GERMANIUM-CONTAINING SEMICONDUCTORS AND COMPOUND SEMICONDUCTORS

(71) Applicant: Tokyo Electron Limited, Minato-ku, Tokyo (JP)

(72) Inventors: Richard H. Gaylord, Saratoga Springs, NY (US); Joel Barnett, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/795,263

(22) Filed: Jul. 9, 2015

(65) Prior Publication Data

US 2016/0013048 A1 Jan. 14, 2016

Related U.S. Application Data

(60) Provisional application No. 62/022,827, filed on Jul. 10, 2014.

(51) Int. Cl.
*H01L 21/311* (2006.01)
*H01L 21/02* (2006.01)
(Continued)

(52) U.S. Cl.
CPC .... *H01L 21/02112* (2013.01); *H01L 21/0234* (2013.01); *H01L 21/02046* (2013.01);
(Continued)

(58) Field of Classification Search
CPC .......... H01L 21/0234; H01L 21/02112; H01L 21/02345; H01L 21/31116; H01L 21/324
(Continued)

(56) References Cited

U.S. PATENT DOCUMENTS

| 5,599,748 A | 2/1997 | Holloway et al. |
| 5,933,705 A | 8/1999 | Geels et al. |

(Continued)

FOREIGN PATENT DOCUMENTS

KR   10-0757738 B1   9/2007

OTHER PUBLICATIONS

Korean Intellectual Property Office (KIPO): International Search Report and the Written Opinion for International application No. PCT/US2015/039726, issued Oct. 20, 2015, 10 pages.
(Continued)

*Primary Examiner* — Nadine G. Norton
*Assistant Examiner* — Maki Angadi
(74) *Attorney, Agent, or Firm* — Wood Herron & Evans LLP

(57) ABSTRACT

A method for gas phase oxide removal and passivation of germanium-containing semiconductors and compound semiconductors is disclosed in various embodiments. According to one embodiment of the invention, a method is provided for processing a semiconductor substrate. The method includes providing a substrate containing a germanium-containing semiconductor or a compound semiconductor, and exposing the substrate to a process gas containing a sulfur-containing gas and a nitrogen-containing gas that passivates a surface of the germanium-containing semiconductor or the compound semiconductor with sulfur. According to another embodiment, the germanium-containing semiconductor or the compound semiconductor has an oxidized layer thereon and the exposing to the process gas removes the oxidized layer from the substrate. According to another embodiment, the substrate may be treated with hydrogen fluoride (HF) gas and ammonia (NH.sub.3) gas to remove the oxidized layer from the substrate before passivating the germanium-containing semiconductor or compound semiconductor with sulfur.

20 Claims, 4 Drawing Sheets

(51) Int. Cl.
*H01L 21/324* (2006.01)
*H01L 21/306* (2006.01)

(52) U.S. Cl.
CPC ...... *H01L 21/02345* (2013.01); *H01L 21/306* (2013.01); *H01L 21/31116* (2013.01); *H01L 21/324* (2013.01)

(58) Field of Classification Search
USPC ............. 438/694, 723, 905, 906; 216/37, 67
See application file for complete search history.

(56) References Cited

U.S. PATENT DOCUMENTS

| | | | |
|---|---|---|---|
| 8,021,565 B2* | 9/2011 | Aoki | H01L 21/02071 134/1.1 |
| 2004/0115908 A1 | 6/2004 | Marsh et al. | |
| 2006/0099782 A1* | 5/2006 | Ritenour | H01L 21/28255 438/542 |
| 2009/0000640 A1 | 1/2009 | Aoki et al. | |
| 2012/0264309 A1 | 10/2012 | Barnett | |
| 2013/0078819 A1 | 3/2013 | Sun et al. | |
| 2013/0126986 A1* | 5/2013 | Brodsky | H01L 21/28255 257/411 |
| 2014/0027884 A1* | 1/2014 | Tang | H01L 23/293 257/632 |

OTHER PUBLICATIONS

Taiwanese Patent Office, Office Action in counterpart Taiwanese Patent Application No. 104122432, dated Jul. 6, 2016.

* cited by examiner

GAS PHASE OXIDE REMOVAL AND PASSIVATION OF GERMANIUM-CONTAINING SEMICONDUCTORS AND COMPOUND SEMICONDUCTORS

CROSS-REFERENCE TO RELATED APPLICATIONS

This application is related to and claims priority to U.S. Provisional Patent Application Ser. No. 62/022,827 filed on Jul. 10, 2014, the entire contents of which are herein incorporated by reference.

FIELD OF THE INVENTION

The present invention generally relates to a method of manufacturing a semiconductor device, and more particularly to a method of passivating surfaces of germanium-containing semiconductors and compound semiconductors during semiconductor device manufacturing.

BACKGROUND OF THE INVENTION

Semiconductor devices with a high-mobility channel, such as Ge and III-V semiconductors, offer the possibility of increased device performance beyond traditional Si-based devices. In particular, III-V materials such as GaAs, InGaAs, etc., are attractive candidates due to their lower effective mass and higher mobility for charge carriers compared to Si. Various processing steps in semiconductor device manufacturing require that oxides that grow or are deposited on III-V materials be removed. Also, there is a need for the clean, oxide-free III-V surfaces to be passivated so that a reasonable amount of time can pass between removing the oxide and further processing, without significant oxide regrowth on the surfaces.

SUMMARY OF THE INVENTION

A method for gas phase oxide removal and passivation of germanium-containing semiconductors and compound semiconductors is disclosed in various embodiments.

According to one embodiment of the invention, a method is provided for processing a semiconductor substrate. The method includes providing a substrate containing a germanium-containing semiconductor or a compound semiconductor, and exposing the substrate to a process gas containing a sulfur-containing gas and a nitrogen-containing gas to passivate a surface of the germanium-containing semiconductor or the compound semiconductor with sulfur. According to one embodiment, the germanium-containing semiconductor or the compound semiconductor has an oxidized layer thereon and the exposing to the process gas removes the oxidized layer from the substrate and passivates a surface of the germanium-containing semiconductor or the compound semiconductor with sulfur.

According to another embodiment, the method includes providing a substrate containing a germanium-containing semiconductor or a compound semiconductor, where the germanium-containing semiconductor or the compound semiconductor has an oxidized layer thereon, and treating the substrate with hydrogen fluoride (HF) gas and ammonia ($NH_3$) gas to remove the oxidized layer from the substrate. The method further includes exposing the substrate to a process gas containing a sulfur-containing gas and a nitrogen-containing gas to passivate a surface of the germanium-containing semiconductor or compound semiconductor with sulfur.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

According to one embodiment of the invention, a method is provided for processing a semiconductor substrate. The method includes providing a substrate containing a germanium-containing semiconductor or a compound semiconductor, and exposing the substrate to a process gas containing a sulfur-containing gas and a nitrogen-containing gas to passivate a surface of the germanium-containing semiconductor or the compound semiconductor with sulfur. According to one embodiment, the germanium-containing semiconductor or the compound semiconductor has an oxidized layer thereon and the exposing to the process gas removes the oxidized layer from the substrate and passivates a surface of the germanium-containing semiconductor or the compound semiconductor with sulfur.

Liquid ammonium sulfide, $(NH_4)_2S$, is an etchant for native oxide on GaAs, and treatment of a GaAs surface by liquid ammonium sulfide passivates a bare (oxide free) GaAs surface. Removal of surface oxidation and subsequent surface passivation can be been done using a sulfur-containing solution (e.g., liquid $(NH_4)_2S$), or a multistep combination of another liquid chemical (e.g., HCl) and a sulfur containing chemical. The inventors have realized that gas exposure methods with no liquid present are required to achieve oxide removal and/or passivation of semiconductor surfaces. This is in part due to increasingly more demanding requirements for good process control as critical dimensions (CDs) of device features become smaller and smaller.

Figure 1A:
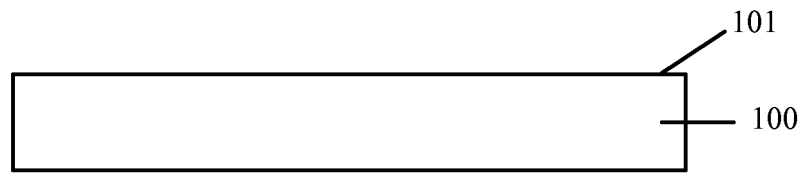
FIGS. 1A-1C schematically show a process flow for processing a semiconductor substrate according to an embodiment of the invention.
Figure 1B:
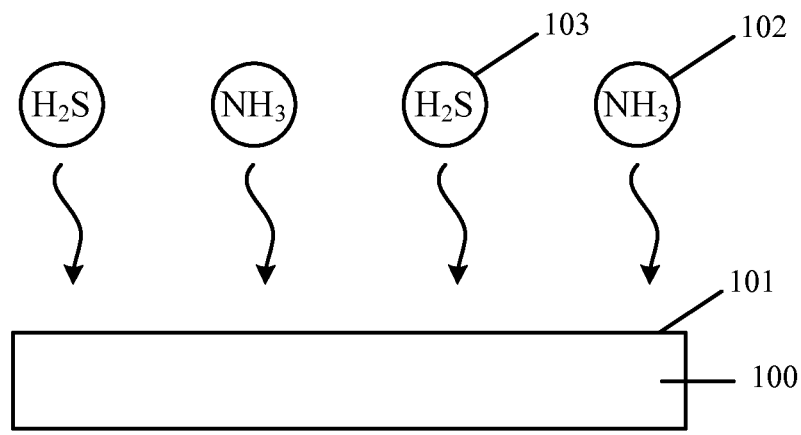
Figure 1C:
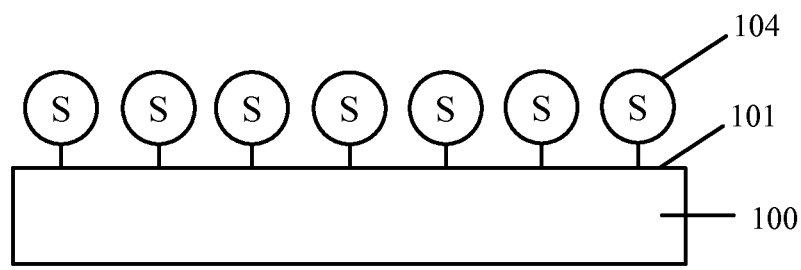

FIGS. 1A-1C schematically show a process flow for processing a semiconductor substrate according to an embodiment of the invention. FIG. 1A shows a substrate 100 that can contain a germanium-containing semiconductor or a compound semiconductor. The substrate 100 can contain or consist of germanium (Ge). According to one embodiment, the substrate 100 may contain $Si_xGe_{1-x}$ compounds, where x is the atomic fraction of Si, 1-x is the atomic fraction of Ge, and $0<x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can include a compressive-strained Ge layer or a tensile-strained $Si_xGe_{1-x}$ (x>0.5) deposited on a relaxed $Si_{0.5}Ge_{0.5}$ buffer layer.

According to one embodiment, the substrate 100 can include a compound semiconductor that contains or consists of a III-V semiconductor, a II-IV semiconductor, or a II-VI semiconductor, or a combination thereof. Examples include GaAs, InGaAs, and AlGaInP.

In FIG. 1B, a surface 101 of the substrate 100 is exposed to a process gas containing a sulfur-containing gas 103 (e.g., $H_2S$) and a nitrogen-containing gas 102 (e.g., $NH_3$). According to one embodiment, the sulfur-containing gas can include $H_2S$, $SO_3$, or $SF_6$, or a combination thereof. According to one embodiment, the nitrogen-containing gas can include $NH_3$, $N_2$, or $N_2H_4$, or a combination thereof. According to one embodiment, the exposing to the process gas can include a non-plasma process. According to another embodiment, the exposing to the process gas can include a light activated process (e.g., UV light), a plasma activated process, or a process that creates chemically reactive free radicals. The method can further include heat-treating the substrate 100 during or following the exposing to sublime one or more by-product materials formed on a surface of the germanium-containing semiconductor or the compound semiconductor.

Exemplary processing conditions for exposing the substrate 100 to the process gas include a substrate temperature between 20° C. and 150° C., a partial pressure between 1 mTorr and 3000 mTorr for the sulfur-containing gas, a partial pressure between 1 mTorr and 3000 mTorr for the nitrogen-containing gas, and a total gas pressure between 20 mTorr and 5000 mTorr for the process gas. The process gas can include a diluent gas (e.g., Ar), where a dilution ratio for diluent gas/sulfur-containing gas can be between 0 and 1000.

As depicted in FIG. 1C, the exposure to the process gas passivates the surface 101 of the germanium-containing semiconductor or the compound semiconductor with sulfur 104. This surface passivation hinders subsequent oxidation of the surface 101 by the sulfur 104 occupying adsorption sites on the surface 101. This results in slowed oxidation of the surface 101, which allows for increased time to elapse before significant oxide growth occurs on the surface 101. The sulfur 104 may be removed from the surface 101 prior to performing additional device processing, for example by heat-treating the substrate 100 to desorb the sulfur 104. Additionally, or alternatively, the substrate 100 may be subjected to a plasma treatment to remove the sulfur 104 from the surface 101.

According to another embodiment of the invention, the method includes providing a substrate containing a germanium-containing semiconductor or a compound semiconductor, where the germanium-containing semiconductor or compound semiconductor has an oxidized layer thereon. The method further includes treating the substrate with hydrogen fluoride gas and ammonia gas to remove the oxidized layer from the substrate, and thereafter, exposing the substrate to a process gas containing a sulfur-containing gas and a nitrogen-containing gas that passivates a surface of the germanium-containing semiconductor or the compound semiconductor with sulfur.

Figure 2A:
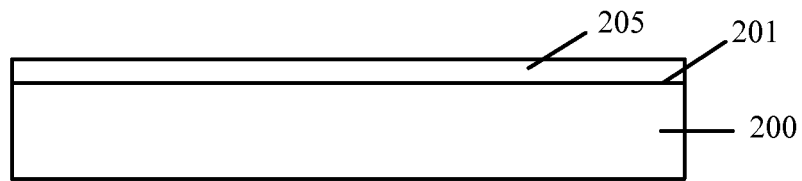
FIGS. 2A-2C schematically show a process flow for processing a semiconductor substrate according to another embodiment of the invention.
Figure 2B:
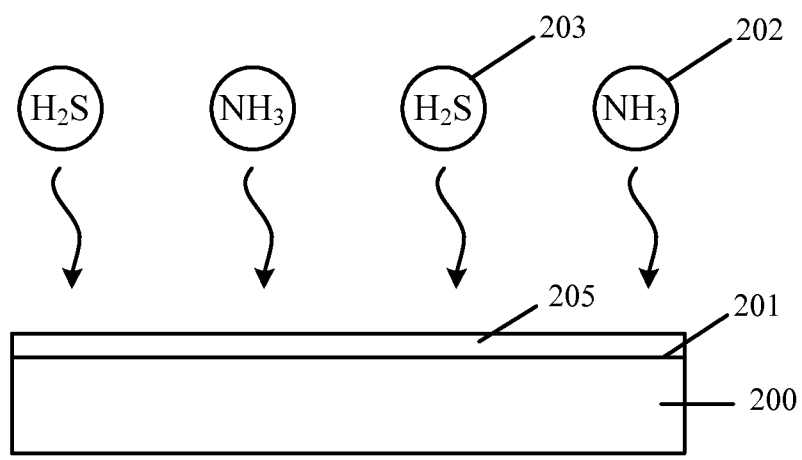
Figure 2C:
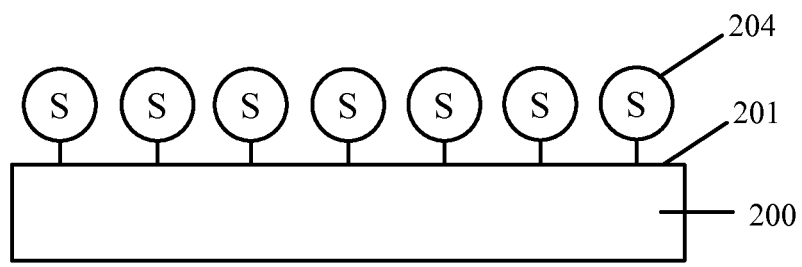

FIGS. 2A-2C schematically show a process flow for processing a semiconductor substrate according to another embodiment of the invention. The embodiment described in FIGS. 2A-2C is similar to the embodiment described in FIGS. 1A-1C but, as depicted in FIG. 2A, the substrate 200 further contains an oxidized layer 205 formed on a surface 201. The oxidized layer 205 can include an oxidized form of the substrate 200 (e.g., $SiGeO_x$) or a material deposited on the substrate 200.

In FIG. 2B, the oxidized layer 205 is exposed to a process gas containing a sulfur-containing gas 203 (e.g., $H_2S$) and a nitrogen-containing gas 202 (e.g., $NH_3$). As depicted in FIG. 2C, the exposure of the process gas removes the oxidized layer 205 and passivates the surface 201 of the germanium-containing semiconductor or the compound semiconductor with sulfur 204.

Figure 3A:
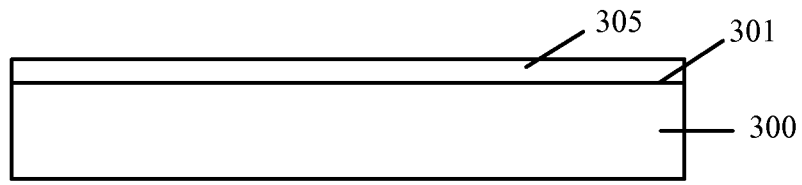
FIGS. 3A-3E schematically show a process flow for processing a semiconductor substrate according to yet another embodiment of the invention.

FIGS. 3A-3E schematically show a process flow for processing a semiconductor substrate according to yet another embodiment of the invention. The embodiment described in FIGS. 3A-3E is similar to the embodiment described in FIGS. 2A-2C and, as depicted in FIG. 3A, the substrate 300 contains an oxidized layer 305 formed on a surface 301. The oxidized layer 305 can include an oxidized form of the substrate 300 (e.g., $SiGeO_x$) or a material deposited on the substrate 300.

Figure 3B:
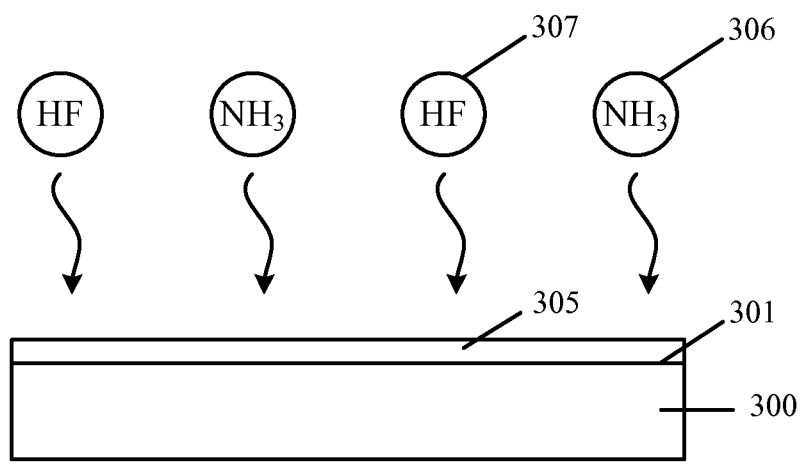

In FIG. 3B, the oxidized layer 305 is treated with hydrogen fluoride (HF) gas 307 and ammonia ($NH_3$) 306 gas to remove the oxidized layer 305 from the substrate 300. Exemplary processing conditions can include a substrate temperature between 20° C. and 150° C., a partial pressure between 1 mTorr and 3000 mTorr for the HF gas, a partial pressure between 1 mTorr and 3000 mTorr for the $NH_3$ gas, and a total gas pressure between 20 mTorr and 5000 mTorr for the process gas. The process gas can include a diluent gas (e.g., Ar), where a dilution ratio of diluent gas/HF gas can be between 0 and 1000. In one example, the substrate 300 may be heat-treated during or following the treating with the HF gas 307 and $NH_3$ gas 306 to sublime one or more by-product materials formed on the surface 301.

Figure 3C:
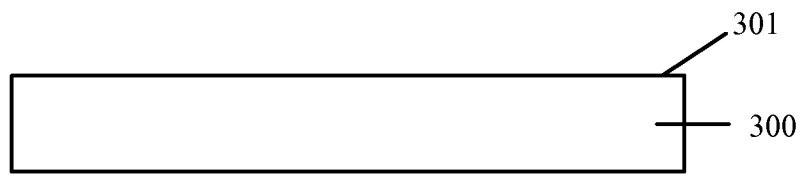

As depicted in FIG. 3C, the exposure of the removes the oxidized layer 305 from the surface 301.

Figure 3D:
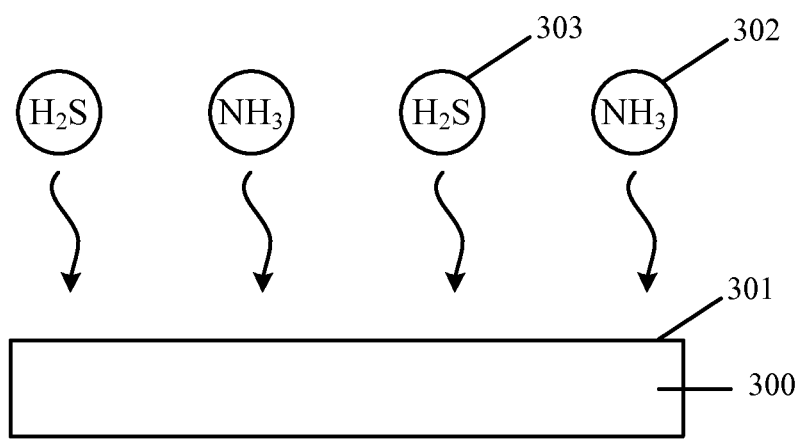
Figure 3E:
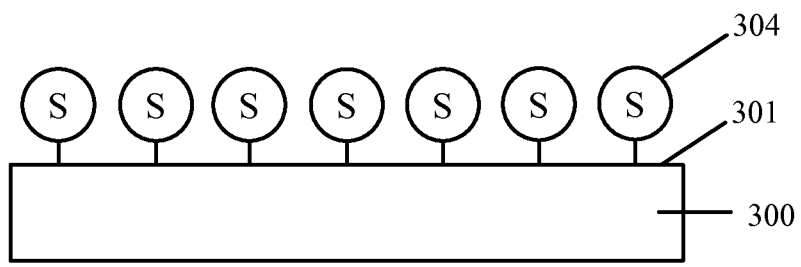

Thereafter, as shown in FIG. 3D, the surface 301 is exposed to a process gas containing a sulfur-containing gas 303 (e.g., $H_2S$) and a nitrogen-containing gas 302 (e.g., $NH_3$). As depicted in FIG. 3E, the exposure to the process gas passivates the surface 301 with sulfur 304.

Semiconductor manufacturing equipment such as the Certas™ and Certas WING™ available from Tokyo Electron Limited, Akasaka, Japan, may be used for performing the gas exposure processes described in embodiments of the invention. These manufacturing equipment are single wafer processing tools, however it is also possible to perform the gas exposure processes in a batch configuration where multiple substrates are simultaneously processed.

Certas™ and Certas WING™ tools include chemical oxide removal (COR) units. COR units may be used in a process that uses $NH_3$ and HF or $NH_3$ and $H_2S$ as a process gas to strip a native oxide from a GaAs surface and passivate the stripped surface with sulfur. A post-COR type process may be applied and may comprise a post heat treatment (PHT) to sublime by-products formed on the substrate during the COR type process. The PHT system may be carried out over a range of temperatures, for example, from about 100° C. to about 300° C., and at a process pressure between about 1 mTorr to about 1 Torr.

A plurality of embodiments for gas phase oxide removal and passivation of germanium-containing semiconductors and compound semiconductors have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a semiconductor device, the method comprising:
providing a substrate containing a germanium-containing semiconductor or a compound semiconductor; and
exposing the substrate to a process gas containing a sulfur-containing gas and a nitrogen-containing gas to passivate a surface of the germanium-containing semiconductor or the compound semiconductor with sulfur, wherein the nitrogen-containing gas includes $NH_3$, $N_2H_4$, or a combination thereof.

2. The method of claim 1, wherein the germanium-containing semiconductor or the compound semiconductor has an oxidized layer thereon and the exposing removes the oxidized layer from the substrate.

3. The method of claim 2, wherein the oxidized layer includes an oxidized form of the germanium-containing semiconductor or the compound semiconductor, or a material deposited on the substrate.

4. The method of claim 1, wherein the sulfur-containing gas includes $H_2S$, $SO_3$, or $SF_6$, or a combination thereof.

5. The method of claim 1, wherein the exposing includes a non-plasma process.

6. The method of claim 1, wherein the exposing includes a light activated process or a plasma activated process.

7. The method of claim 1, wherein the germanium-containing semiconductor is selected from the group consisting of Ge and $Si_xGe_{1-x}$ compounds.

8. The method of claim 1, wherein the compound semiconductor is selected from the group consisting of a III-V semiconductor, a II-IV semiconductor, and a II-VI semiconductor.

9. The method of claim 1, wherein the compound semiconductor is selected from the group consisting of GaAs, InGaAs, and AlGaInP.

10. The method of claim 1, wherein the germanium-containing semiconductor or the compound semiconductor has an oxidized layer thereon, the method further comprising
treating the substrate with hydrogen fluoride gas and ammonia gas to remove the oxidized layer from the substrate.

11. The method of claim 10, further comprising
heat-treating the substrate during or following the treating.

12. The method of claim 1, further comprising
heat-treating the substrate during or following the exposing to sublime one or more by-product materials formed on a surface of the germanium-containing semiconductor or the compound semiconductor.

13. A method for forming a semiconductor device, the method comprising:
providing a substrate containing a germanium-containing semiconductor or a compound semiconductor, wherein the germanium-containing semiconductor or compound semiconductor has an oxidized layer thereon;
treating the substrate with hydrogen fluoride gas and ammonia gas to remove the oxidized layer from the substrate; and
thereafter, exposing the substrate to a process gas containing a sulfur-containing gas and a nitrogen-containing gas that passivates a surface of the germanium-containing semiconductor or the compound semiconductor with sulfur,
wherein the nitrogen-containing gas includes $NH_3$, $N_2H_4$, or a combination thereof.

14. The method of claim 13, wherein the oxidized layer includes an oxidized form of the germanium-containing semiconductor or the compound semiconductor, or a material deposited on the substrate.

15. The method of claim 13, wherein the sulfur-containing gas includes $H_2S$, $SO_3$, or $SF_6$, or a combination thereof.

16. The method of claim 13, wherein the germanium-containing semiconductor is selected from the group consisting of Ge and $Si_xGe_{1-x}$ compounds.

17. The method of claim 13, wherein the compound semiconductor is selected from the group consisting of a III-V semiconductor, a II-IV semiconductor, and a II-VI semiconductor.

18. The method of claim 13, wherein the compound semiconductor is selected from the group consisting of GaAs, InGaAs, and AlGaInP.

19. A method for forming a semiconductor device, the method comprising:
providing a substrate containing a germanium-containing semiconductor or a compound semiconductor, wherein the germanium-containing semiconductor or compound semiconductor has a material layer deposited on a surface thereof;
treating the substrate with hydrogen fluoride gas and ammonia gas to remove the material layer from the substrate to expose the surface; and
thereafter, exposing the substrate to a process gas containing a sulfur-containing gas and a nitrogen-containing gas that passivates the surface of the germanium-containing semiconductor or the compound semiconductor with sulfur.

20. The method of claim 19, wherein the material layer is a deposited oxide material.

* * * * *